United States Patent
Lee

(10) Patent No.: US 8,384,634 B2
(45) Date of Patent: Feb. 26, 2013

(54) DISPLAY WITH REDUCED PARASITIC EFFECTS

(75) Inventor: Yongman Lee, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 577 days.

(21) Appl. No.: 12/504,220

(22) Filed: Jul. 16, 2009

(65) Prior Publication Data

US 2010/0073350 A1    Mar. 25, 2010

Related U.S. Application Data

(60) Provisional application No. 61/099,847, filed on Sep. 24, 2008.

(51) Int. Cl.
*G09G 3/36* (2006.01)

(52) U.S. Cl. ............ 345/87; 345/88; 345/103; 345/204; 345/206; 345/211

(58) Field of Classification Search ............ 345/87–103, 345/204–206, 211–213
See application file for complete search history.

(56) References Cited

U.S. PATENT DOCUMENTS

| | | | | |
|---|---|---|---|---|
| 3,704,389 A * | 11/1972 | McClelland | .................... | 377/77 |
| 5,434,599 A * | 7/1995 | Hirai et al. | .................... | 345/100 |
| 5,442,370 A * | 8/1995 | Yamazaki et al. | .................... | 345/94 |
| 5,459,443 A * | 10/1995 | Mouissie | .................... | 333/184 |
| 5,597,183 A * | 1/1997 | Johnson | .................... | 283/83 |
| 5,619,221 A * | 4/1997 | Hirai et al. | .................... | 345/58 |
| 5,646,643 A * | 7/1997 | Hirai et al. | .................... | 345/100 |
| 5,670,994 A * | 9/1997 | Kawaguchi et al. | .................... | 345/206 |
| 5,861,861 A * | 1/1999 | Nolan et al. | .................... | 345/87 |
| 6,133,978 A * | 10/2000 | Tajima | .................... | 349/150 |
| 6,157,357 A * | 12/2000 | Kim | .................... | 345/87 |
| 6,249,270 B1 * | 6/2001 | Ito | .................... | 345/100 |
| 6,320,568 B1 * | 11/2001 | Zavracky | .................... | 345/101 |
| 6,384,805 B1 * | 5/2002 | Takada | .................... | 345/87 |
| 7,859,496 B2 * | 12/2010 | Kim et al. | .................... | 345/87 |
| 8,035,586 B2 * | 10/2011 | Hayafuji | .................... | 345/82 |
| 8,054,280 B2 * | 11/2011 | Choi et al. | .................... | 345/100 |

(Continued)

FOREIGN PATENT DOCUMENTS

| | | |
|---|---|---|
| EP | 0 376 759 | 7/1990 |
| EP | 0 789 346 | 8/1997 |

(Continued)

OTHER PUBLICATIONS

National Semiconductor Corporation, "FPD93140: Small Format a Si AMLCD Gate Driver with Integrated Power Supply" (May 2005).

(Continued)

*Primary Examiner* — Lun-Yi Lao
*Assistant Examiner* — Kelly B Hegarty
(74) *Attorney, Agent, or Firm* — Womble Carlyle Sandridge & Rice LLP

(57) ABSTRACT

Visual artifacts in a display are reduced by moving, to the extent possible, display driver components to the display surface itself, thereby shortening conductor distances and reducing the parasitic effects caused by parasitic resistance of the conductors between the display power supply and the display, and between the stabilizing capacitors and the display. To avoid interference with the device housing, low-profile driver components, including either or both of stabilizing capacitors and power supply terminals, can be provided and bonded to the surface of the display side of the outer layer of the display. Alternatively, the stabilizing capacitors can be formed on the display side in the same way that, e.g., in an LCD display, the transparent electrodes for controlling the liquid crystals are formed.

23 Claims, 4 Drawing Sheets

U.S. PATENT DOCUMENTS

| | | | |
|---|---|---|---|
| 2002/0024484 A1* | 2/2002 | Lee et al. | 345/87 |
| 2002/0060767 A1* | 5/2002 | Muramatsu et al. | 349/139 |
| 2002/0067441 A1* | 6/2002 | Nakashima et al. | 349/38 |
| 2003/0098835 A1* | 5/2003 | O'Donnell et al. | 345/87 |
| 2003/0117361 A1* | 6/2003 | Sono | 345/94 |
| 2004/0174487 A1* | 9/2004 | Yamazaki et al. | 349/150 |
| 2005/0057468 A1* | 3/2005 | Yamamoto et al. | 345/87 |
| 2005/0253836 A1 | 11/2005 | Kim et al. | |
| 2006/0038758 A1* | 2/2006 | Routley et al. | 345/81 |
| 2006/0132417 A1* | 6/2006 | Shigenobu et al. | 345/98 |
| 2006/0145995 A1* | 7/2006 | Kim et al. | 345/98 |
| 2007/0008274 A1* | 1/2007 | Nakanishi et al. | 345/101 |
| 2007/0024554 A1* | 2/2007 | Ko | 345/87 |
| 2007/0085803 A1* | 4/2007 | Chu | 345/98 |
| 2008/0062100 A1* | 3/2008 | Hong et al. | 345/87 |
| 2008/0174463 A1* | 7/2008 | Daito | 341/150 |
| 2008/0273007 A1* | 11/2008 | Ng et al. | 345/107 |
| 2009/0284513 A1* | 11/2009 | Weindorf et al. | 345/211 |
| 2010/0013814 A1* | 1/2010 | Jarczyk | 345/208 |
| 2010/0259563 A1* | 10/2010 | Tokuda et al. | 345/690 |

FOREIGN PATENT DOCUMENTS

EP   0 911 681   4/1999

OTHER PUBLICATIONS

NEC Electronics Corporation, "MOS Integrated Circuit μPD161704A: 1 Chip Driver for 240 RGB × 320 DOT TFT-LCD With RAM Data Sheet" (Mar. 2006).

* cited by examiner

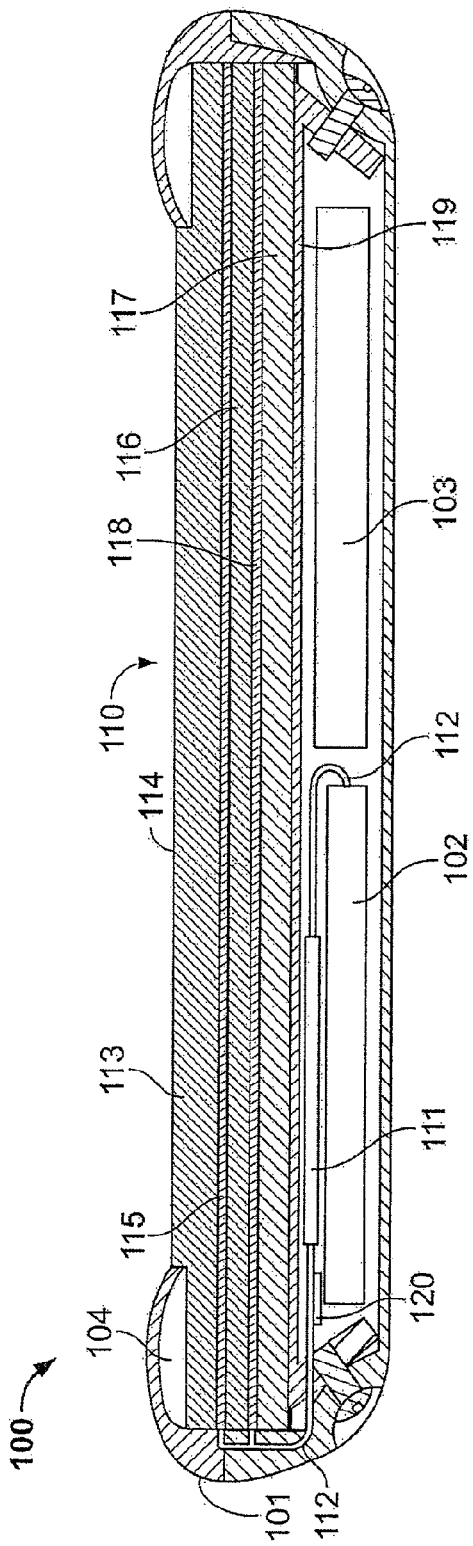
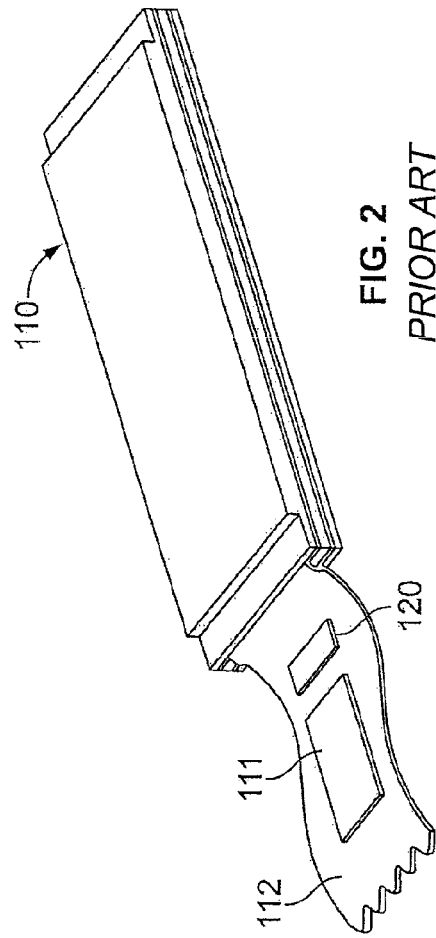
FIG. 1
PRIOR ART
FIG. 2
PRIOR ART

DISPLAY WITH REDUCED PARASITIC EFFECTS

CROSS REFERENCE TO RELATED APPLICATION

This claims the benefit of copending, commonly-assigned U.S. Provisional Patent Application No. 61/099,847, filed Sep. 24, 2008, which is hereby incorporated by reference herein in its entirety.

BACKGROUND OF THE INVENTION

This relates to the reduction of parasitic effects in a display by moving driver circuitry as close as possible to the display.

In small-form-factor devices such as portable electronic devices, the size of the device makes it difficult to keep the display driver circuitry near the display itself. However, the small size of such devices magnifies the effect of non-zero resistance and capacitance in wires or circuit board traces connecting the driver circuitry to the display, resulting in visual artifacts.

SUMMARY OF THE INVENTION

The present invention reduces visual artifacts by moving, to the extent possible, display driver components to the display surface itself, thereby shortening conductor distances and reducing the parasitic effects caused by parasitic resistance of the conductors between the display power supply and the display, and between the stabilizing capacitors and the display.

In a first embodiment, low-profile driver components, including either or both of stabilizing capacitors and power supply terminals, can be provided and bonded to the surface of the display side of the outer layer of the display, which may be glass or other transparent material. In a second embodiment, the stabilizing capacitors can be formed on the display side in the same way that, e.g., in an LCD display, the transparent electrodes for controlling the liquid crystals are formed.

Therefore, in accordance with embodiments of the invention, there is provided a display for an electronic device. The display includes a transparent layer having display elements mounted thereon and having a display side facing outwardly of the device, and driver circuitry for the display elements. At least a portion of the driver circuitry is mounted on the display side of the transparent layer.

An electronic device including such a display, a method of forming such a display, and a method of operating such a display to reduce parasitic artifacts, are also provided.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which:

FIG. 1 is a cross-sectional view of an electronic device including a display having a known driver arrangement;

FIG. 2 is a perspective view of the display and driver removed from the device of FIG. 1;

DETAILED DESCRIPTION

Figure 3:
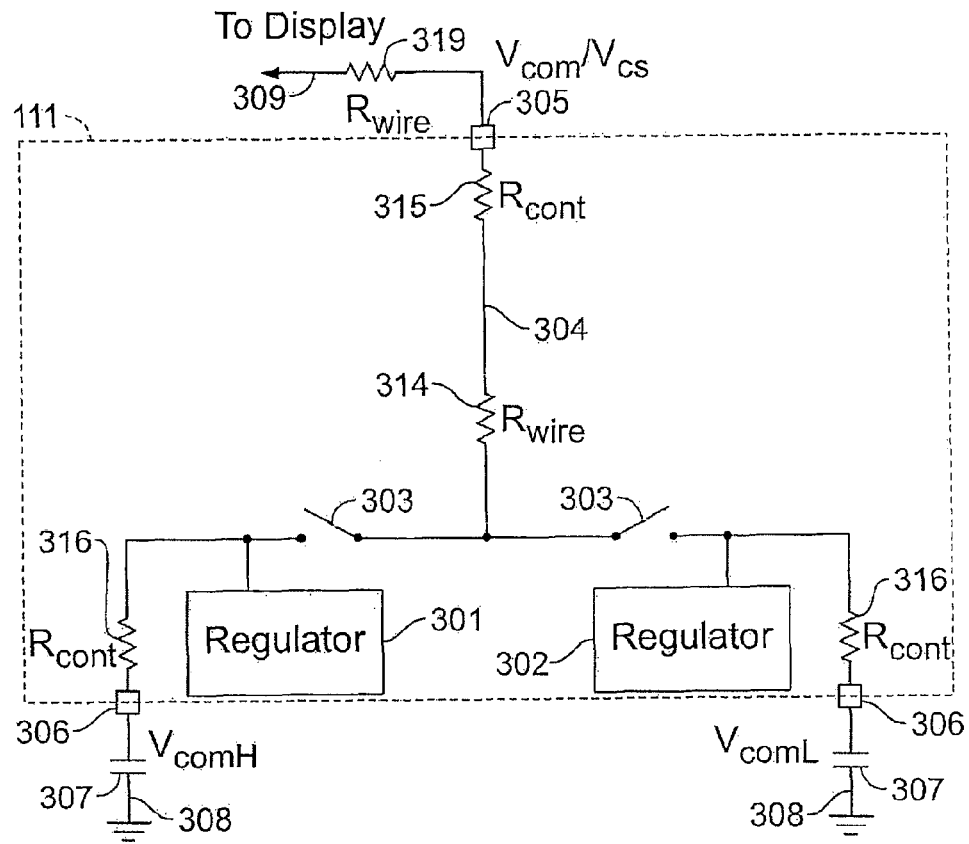
FIG. 3 is a schematic diagram illustrating electrically the potential sources of parasitic effects in the display and driver of FIGS. 1 and 2.

In previously known devices, having host circuitry (such as a processor) and a display panel, the display panel power supply may be generated at the host side of display driver circuitry, even though it is output from the other end of the driver and then routed to the display panel itself. The switches that control the power supplies also may be located at the host side of the driver circuitry. This long routing—both within the driver circuitry and then out to the display panel—may give rise to parasitic resistances. The resulting voltage drop along any routing wire is shared among all pixels that are connected to that wire, generating the equivalent of ground noise or supply noise.

Resulting crosstalk may appear on the display as a visual artifact. As a result, the image that draws the smaller current may resemble the image that draws the larger current. For example, in a normally white panel, a black pattern draws more current. When a white pattern shares the supply, crosstalk may cause it to appear gray.

Stabilizing capacitors may be used to reduce crosstalk. However, currents flow transiently while the capacitors charge and discharge. Crosstalk thus continues until the capacitors have charged or discharged for a sufficient amount of time to allow the transient currents to settle down. However, as the resolution of the display increases for a given refresh rate (e.g., 60 Hz), the time available for the transients to settle is reduced.

FIGS. 1 and 2 show a portable electronic device 100 having a display, with the display 110 and display driver 111 in a known arrangement. As shown, housing 101 of device 100 encloses display 110, as well as main circuitry 102 for performing the primary function of device 100 (e.g., a media player or mobile communications device) and battery 103 for powering device 100. The display output of main circuitry 102 may be output through display driver 111 which may be located on a flexible circuit board 112 between main circuitry 102 and display 110.

Display 110 may have an outer layer 113 having an outward facing display face 114. Outer layer 113 may be any suitable transparent material, such as glass. Electrodes 115 for controlling the liquid crystal display may be formed on the underside of outer layer 113. A layer of liquid crystals 116 may be sandwiched between outer layer 113 and an inner layer 117 which includes one or more ground electrodes 118 on its surface. A bracket 119 may be provided to secure the entire assembly into housing 101.

When device 100 is assembled as in FIG. 1, driver circuitry 111 as well as stabilizing capacitors 120 (which also may be included within circuitry 111 rather than as discrete components) are located on flexible circuit board 112 adjacent layer 117 at the underside of display 110. Therefore, in small-form-factor devices, even though overall dimensions are smaller, display signals actually may have to travel farther to reach the display than they would in a larger device. Signals travelling from circuitry 111 to display 110 must travel along the underside of display 110 via flexible circuit board 112 and around the edge of display 110 to outer layer 113. Thus, small-form-factor device displays may be more susceptible to parasitic effects than displays in larger devices.

FIG. 3 shows the electrical consequences of this arrangement in a simplified depiction of driver circuitry 111. Driver circuitry 111 includes a plurality of voltage regulators 301, 302 for driving display 110 with various voltages including common voltage $V_{COM}$ and secondary supply voltage $V_{CS}$. Which of voltage regulators 301, 302 is in operation may be determined by automatically controlled switches 303. The outputs of both voltage regulators 301, 302 may be output to display 110 via wire 304 running internally of driver circuitry 111 to contact 305. Both wire 304 and contact 305 have intrinsic resistances 314, 315, in addition to the resistance 319 of wire 309 outside circuitry 111 on flexible circuit board 112, any of which may contribute to parasitic effects as described above.

The outputs of both voltage regulators 301, 302 also may be output via contacts 306 to stabilizing capacitors 307 which are connected between circuitry 111 and ground plane 118 of display 110 via wires 308. The intrinsic resistance (not shown) of wires 308, as well as intrinsic contact resistances 316 of contacts 306, also may contribute to parasitic effects as described above.

In accordance with embodiments of this invention, parasitic artifacts, including those induced by crosstalk, may be reduced by reducing the intrinsic resistances of wires 304, 308, as well as contact resistances 315, 316. The intrinsic resistances of wires 304, 308 may be reduced primarily by shortening wires 304, 308. In the case of wire 304, this means moving voltage regulators 301, 302 closer to the display end of circuitry 111 where contact 305 is located. In the case of wires 308, this means moving at least part of circuitry 111 closer to display 110, which also will shorten wire 309 and reduce its intrinsic resistance 319.

Figure 4:
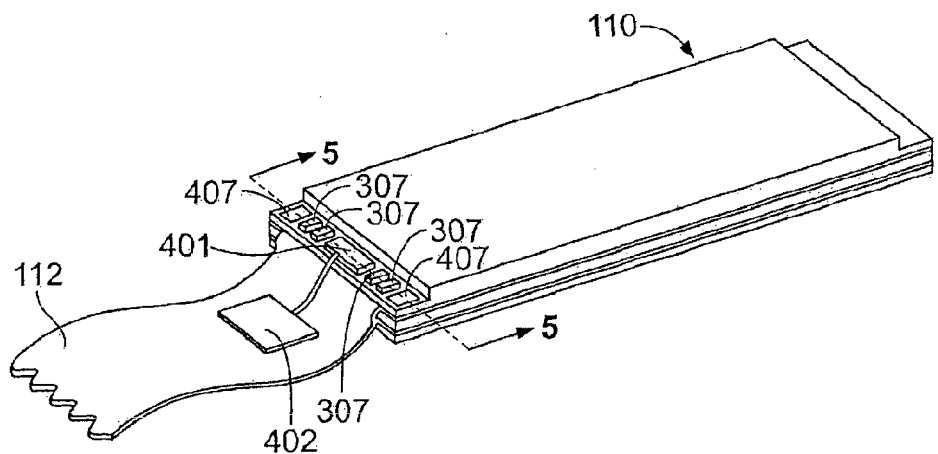
FIG. 4 is a perspective view of a display/driver arrangement in accordance with an embodiment of the invention.
Figure 5:
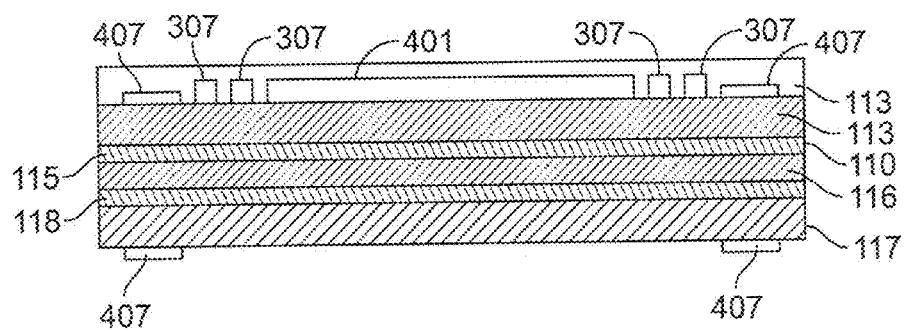
FIG. 5 is a cross-sectional view, taken from line 5-5 of FIG. 4, showing components mounted on the display in accordance with embodiments of the invention.

As shown in FIG. 4, integrated circuit 401, containing at least a portion of circuitry 111 is surface-mounted to outer glass layer 113. If integrated circuit 401 does not contain all of circuitry 111, the remainder may be in integrated circuit 402 on flexible circuit board 112. Capacitors 307 also may be surface-mounted on glass layer 113. As seen in FIG. 5, capacitors 307 and integrated circuit 401 should be about the same height, which should present a low profile to allow them to fit between glass layer 113 and housing 101 (e.g., in space 104).

Stabilizing capacitors 407 also may be formed directly on glass layer 113 just as electrodes 118 are formed. Indeed, rather than specially forming capacitors 407, it may be possible to route conductor traces directly opposite one another on opposite sides of display 110, and use their capacitance as capacitors 407. However, whether capacitors 407 are specially formed or not, given the nature of the materials involved and the available area in a typical portable device display, the maximum capacitance that might be expected in capacitors 407 might be about 100 nF, whereas surface-mounted capacitors 307 (e.g., ceramic capacitors) might have capacitances of about 1 µF. Therefore, in one embodiment, a combination of surface-mounted capacitors 307 and capacitors 407 formed on the glass may be used, with the larger capacitors 307 being used where the current loading is expected to be greater.

For example, in some displays operating in accordance with the Mobile Industry Processor Interface (MIPI®) standard, the power supply voltages may include supply voltage $V_{MIPI}$, gate voltages $V_{GH}$ and $V_{GL}$, and common/secondary voltages $V_{COM}$ and $V_{CS}$. Supply voltage $V_{MIPI}$ would be the highest of those voltages, and its stabilizing capacitor may be surface-mounted capacitor 307. The other voltages would be lower, and their stabilizing capacitors may be capacitors 407 formed on the glass. Of those other voltages, the gate voltages $V_{GH}$ and $V_{GL}$ typically run on rails along edges of glass 113. To avoid using extra area on glass 113, traces can be formed on the opposite side of glass 113 opposite the gate voltage rails. Acting along with the gate voltage rails, those traces can form stabilizing capacitors, without occupying additional area that is not already occupied. Capacitors 407 as shown are in those positions, but also may be formed elsewhere on glass 113.

Figure 6:
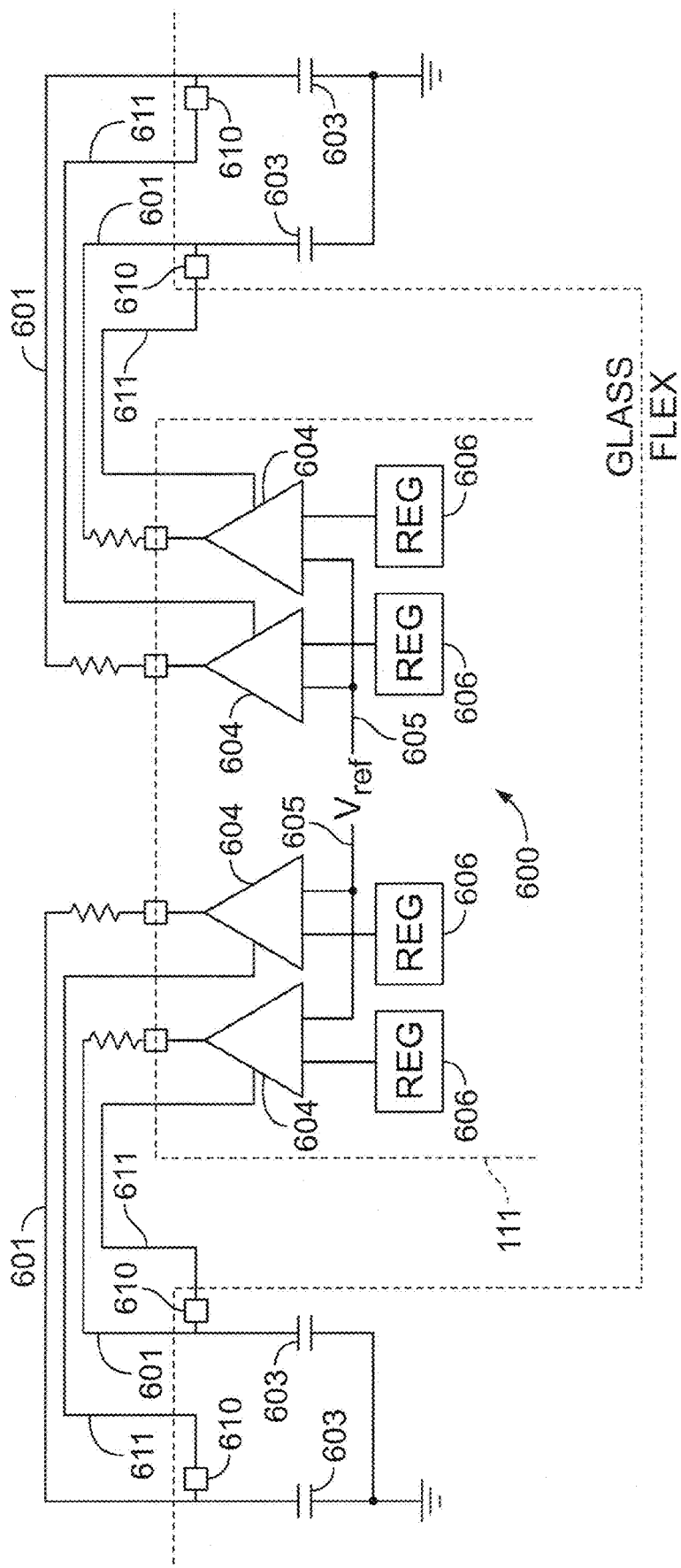
FIG. 6 is a schematic diagram of a voltage regulator arrangement in accordance with an embodiment of the invention.

In such an embodiment, there are power supply traces on both sides of the glass. Typically, both the positive and negative terminals are regulated. FIG. 6 shows a voltage regulator arrangement 600 that can be located at the corners of the driver circuitry 111 so as to be as close as possible to display 110. Wires 601 on flexible circuit board 112 connect the terminals 602 to display 110, where capacitors 603 (which may be of either type described above) may be located.

Voltage regulator arrangement 600 may include separate regulators 604, each of which is supplied a reference voltage 605. The output of each regulator 604 may be programmable by loading the desired value into respective register 606. With the shorter distances, contact and wire resistances between regulators 604 and glass wiring traces 115 may be reduced but may not be eliminated. Therefore, in accordance with an embodiment of the invention, the sensing terminal 610 of the voltage regulator 604 can be moved to the glass 113 to sense the actual voltage delivered to glass 113, rather than the on-chip driver voltage. The sensed voltage can be fed back, as at 611, to driver 604 whose output may be adjusted based on the sensed voltage.

Driver output currents are usually of higher magnitude than driver input currents, meaning that parasitic resistance can be of concern on the output, but may be of less concern on the inputs. With possibility, according to the present invention, of locating the terminals on glass 113 as well as on driver circuitry 111, there is more flexibility in laying out the wiring to minimize parasitic artifacts. For example, to conserve glass area, the input terminals may be kept on a portion of driver circuitry 111 that is not on the glass, because of the lessened concern regarding parasitic effects.

Figure 7:
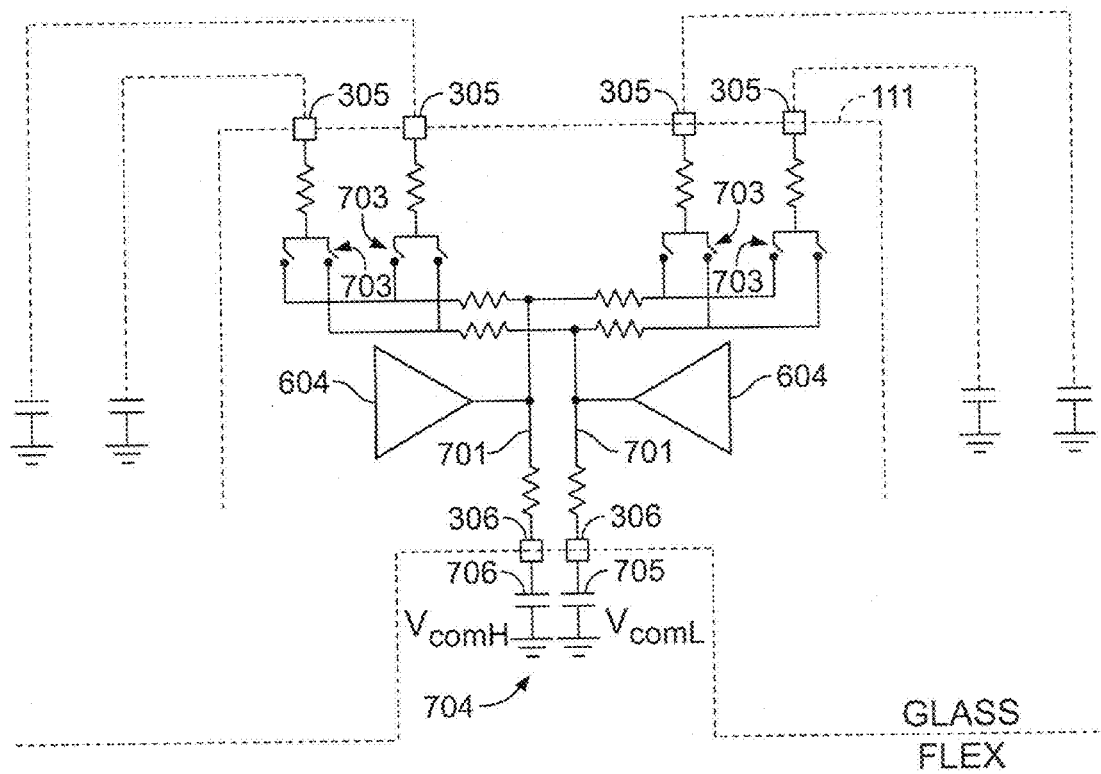
FIG. 7 is a schematic diagram of a programmable contact arrangement in accordance with an embodiment of the invention.

As seen in FIG. 7, the $V_{COMH}$ and $V_{COML}$ voltages may be programmably applied to resistance-balanced conductors 701, via terminals 306 on glass 113, which connect to circuitry 704 on flexible circuit board 112, which may include discrete capacitors 705, 706. Conductors 701 connect to programmable switches 703, which may be opened and closed under the control of properly timed control signals to control the voltage in a manner similar to the input control of regulators 604 by registers 606. Thus different signals may be applied either at the driver, or directly on the glass, to circuitry including stabilizing capacitors that are either discrete or formed directly on the glass.

Thus it is seen that apparatus and methods for reducing parasitic effects in displays for small-form-factor devices have been provided. It will be understood that the foregoing is only illustrative of the principles of the invention, and that various modifications can be made by those skilled in the art without departing from the scope and spirit of the invention, and the present invention is limited only by the claims that follow.

What is claimed is:

1. A display for an electronic device, the display comprising:

an inner layer;
a transparent outer layer having display elements mounted thereon and having a display side facing outwardly of the device; and
driver circuitry for the display elements;
wherein the driver circuitry includes at least one capacitor formed by a first trace disposed on the display side of the transparent outer layer and a second trace formed on a surface of the inner layer opposite to the outwardly facing surface of the transparent outer layer.

2. The display of claim 1 wherein:
the driver circuitry includes power supply terminals; and
the at least a portion of the driver circuitry that is mounted on the display side of the transparent outer layer comprises at least one of the power supply terminals.

3. The display of claim 2 wherein:
the at least a portion of the driver circuitry that is mounted on the display side of the transparent outer layer further comprises a sense terminal on the transparent outer layer;
the sense terminal feeds back to the driver circuitry the voltage delivered by the driver circuitry to the transparent outer layer; and
the driver circuitry adjusts its output based on the voltage fed back by the sense terminal.

4. The display of claim 2 wherein:
the at least a portion of the driver circuitry that is mounted on the display side of the transparent outer layer further comprises a stabilizing capacitor.

5. The display of claim 4 wherein the stabilizing capacitor is a discrete capacitor bonded to the transparent outer layer.

6. The display of claim 4 wherein the stabilizing capacitor is formed on the transparent outer layer.

7. The display of claim 6 wherein:
the at least a portion of the driver circuitry that is mounted on the display side of the transparent outer layer comprises supply voltage wiring traces;
the driver circuitry further comprises supply voltage wiring traces mounted on a side of the inner layer opposite the display side of the transparent outer layer; and
the supply voltage wiring traces on the display side of the transparent outer layer and the supply voltage wiring traces on the side of the layer opposite the display side of the transparent outer layer are arranged opposite one another to form at least a portion of the stabilizing capacitor.

8. The display of claim 1 wherein:
the at least a portion of the driver circuitry that is mounted on the display side of the transparent outer layer comprises a sense terminal on the transparent outer layer;
the sense terminal feeds back to the driver circuitry the voltage delivered by the driver circuitry to the transparent outer layer; and
the driver circuitry adjusts its output based on the voltage fed back by the sense terminal.

9. The display of claim 1 wherein:
the at least a portion of the driver circuitry that is mounted on the display side of the transparent outer layer comprises a plurality of programmable switches and a plurality of stabilizing capacitors;
the driver circuitry comprises a plurality of voltage regulators;
the plurality of programmable switches programmably connect respective ones of the plurality of voltage regulators to respective ones of the stabilizing capacitors.

10. An electronic device comprising:
a housing;
a display mounted in said housing and including an inner layer, and a transparent outer layer having display elements mounted thereon and having a display side facing outwardly of the housing; and
driver circuitry for the display elements;
wherein the driver circuitry includes at least one capacitor formed by a first trace disposed on the display side of the transparent outer layer and a second trace formed on a surface of the inner layer opposite to the outwardly facing surface of the transparent outer layer; and
at least a portion of the driver circuitry is mounted on the display side of the transparent outer layer and is sized to avoid interfering with the housing.

11. The electronic device of claim 10 wherein:
the driver circuitry includes power supply terminals; and
the at least a portion of the driver circuitry that is mounted on the display side of the transparent outer layer comprises at least one of the power supply terminals.

12. The electronic device of claim 11 wherein:
the at least a portion of the driver circuitry that is mounted on the display side of the transparent outer layer further comprises a sense terminal on the transparent outer layer;
the sense terminal feeds back to the driver circuitry the voltage delivered by the driver circuitry to the transparent outer layer; and
the driver circuitry adjusts its output based on the voltage fed back by the sense terminal.

13. The electronic device of claim 11 wherein:
the at least a portion of the driver circuitry that is mounted on the display side of the transparent outer layer further comprises a stabilizing capacitor.

14. The electronic device of claim 13 wherein the stabilizing capacitor is a discrete capacitor bonded to the transparent outer layer.

15. The electronic device of claim 13 wherein the stabilizing capacitor is formed on the transparent outer layer.

16. The electronic device of claim 15 wherein:
the at least a portion of the driver circuitry that is mounted on the display side of the transparent outer layer comprises supply voltage wiring traces;
the driver circuitry further comprises supply voltage wiring traces mounted on a side of the inner layer opposite the display side of the transparent outer layer; and
the supply voltage wiring traces on the display side of the transparent outer layer and the supply voltage wiring traces on the side of the inner layer opposite the display side of the transparent outer layer are arranged opposite one another to form at least a portion of the stabilizing capacitor.

17. The electronic device of claim 10 wherein:
the at least a portion of the driver circuitry that is mounted on the display side of the transparent outer layer comprises a sense terminal on the transparent outer layer;
the sense terminal feeds back to the driver circuitry the voltage delivered by the driver circuitry to the transparent outer layer; and
the driver circuitry adjusts its output based on the voltage fed back by the sense terminal.

18. The electronic device of claim 10 wherein:
the at least a portion of the driver circuitry that is mounted on the display side of the transparent outer layer comprises a plurality of programmable switches and a plurality of stabilizing capacitors;
the driver circuitry comprises a plurality of voltage regulators;

the plurality of programmable switches programmably connect respective ones of the plurality of voltage regulators to respective ones of the stabilizing capacitors.

19. A method of forming a display for an electronic device so as to reduce parasitic artifacts on the display, wherein the display has (a) an inner layer, and a transparent outer layer having display elements mounted thereon and having a display side facing outwardly of the device, and (b) driver circuitry for the display elements; the method comprising:
- providing at least one capacitor formed by a first trace disposed on the display side of the transparent outer layer and a second trace formed on a surface of the inner layer opposite to the outwardly facing surface of the transparent outer layer;
- providing, at least partly on the display side of the transparent outer layer, stabilizing capacitors;
- providing, on the display side of the transparent outer layer, terminals for connecting supply voltages from the driver circuitry to the display elements; and
- providing, on the display side of the transparent outer layer, programmable switches for programmably connecting respective ones of the terminals to respective ones of the stabilizing capacitors; whereby:
- the supply voltages are selectably connectable to respective ones of the stabilizing capacitors.

20. The method of claim 19 wherein providing stabilizing capacitors at least partly on the display side of the transparent outer layer comprises bonding discrete capacitors to the transparent outer layer.

21. The method of claim 19 wherein providing stabilizing capacitors at least partly on the display side of the transparent outer layer comprises forming capacitors at least partly on the transparent outer layer.

22. The method of claim 21 wherein forming capacitors at least partly on the transparent outer layer comprises forming, on a side of the inner layer opposite the display side of the transparent outer layer, first conductors opposite second conductors on the display side of the transparent outer layer, and using the first and second conductors as conductors and as a capacitor.

23. A method of operating a display for an electronic device so as to reduce parasitic artifacts on the display, wherein the display has (a) an inner layer, and a transparent outer layer having display elements mounted thereon and having a display side facing outwardly of the device, and (b) driver circuitry for the display elements including, on the display side of the transparent outer layer, (a) stabilizing capacitors, (b) terminals for connecting supply voltages from the driver circuitry to the display elements, (c) programmable switches for programmably connecting respective ones of the terminals to respective ones of the stabilizing capacitors; and (d) at least one capacitor formed by a first trace disposed on the display side of the transparent outer layer and a second trace formed on a surface of the inner layer opposite to the outwardly facing surface of the transparent outer layer, the method comprising:
- operating the programmable switches to apply respective supply voltages of the driver circuitry to respective ones of the stabilizing capacitors.

* * * * *